United States Patent [19]

Morris et al.

[11] 4,064,622

[45] Dec. 27, 1977

[54] METHOD OF MAKING A FLEXIBLE JUMPER STRIP

[75] Inventors: Gilbert Morris, Amherst; Richard P. Heinrich, Westville, both of N.H.

[73] Assignee: Teledyne Electro Mechanisms, Nashua, N.H.

[21] Appl. No.: 681,780

[22] Filed: Apr. 30, 1976

[51] Int. Cl.² .................. H05K 3/06; H01R 43/00
[52] U.S. Cl. .......................... 29/625; 29/629; 29/630 B; 339/17 F
[58] Field of Search .......... 29/629, 630 B, 630 C, 29/625; 339/17 LC, 17 F, 19; 174/117 F, 117 PC

[56] References Cited

U.S. PATENT DOCUMENTS

| | | | |
|---|---|---|---|
| 2,994,058 | 7/1961 | Dahlgren | 339/100 |
| 3,221,286 | 11/1965 | Fedde | 339/17 F |
| 3,382,572 | 5/1968 | Crawford et al. | 29/630 B X |
| 3,399,452 | 9/1968 | Reid | 29/629 |
| 3,601,755 | 8/1971 | Shiells, Jr. | 339/19 |
| 3,706,065 | 12/1972 | Knitter et al. | 339/17 LC |
| 3,911,716 | 10/1975 | Weglin | 29/625 X |
| 3,920,301 | 11/1975 | Roberts et al. | 339/17 F |
| 3,997,229 | 12/1976 | Narozny et al. | 339/17 F X |

*Primary Examiner*—Carl E. Hall
*Attorney, Agent, or Firm*—Brumbaugh, Graves, Donohue & Raymond

[57] ABSTRACT

A flexible jumper strip has a V-shape for the ends of its leads in order to increase its mechanical strength. In one embodiment the ends of the leads are folded back to give even more strength. In making the jumper strip conductor leads are formed on a conductor sheet laminated to an insulator sheet. Then the lead ends are given a V-shape with a mechanical punching device.

8 Claims, 20 Drawing Figures

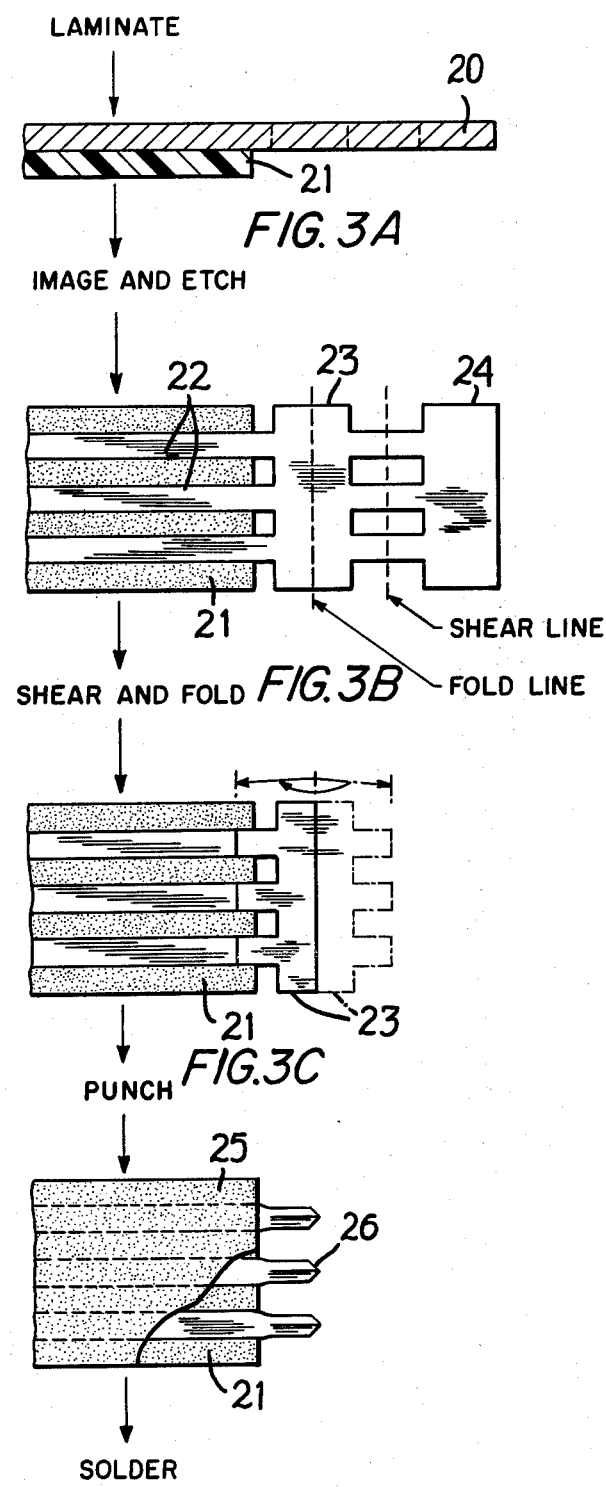
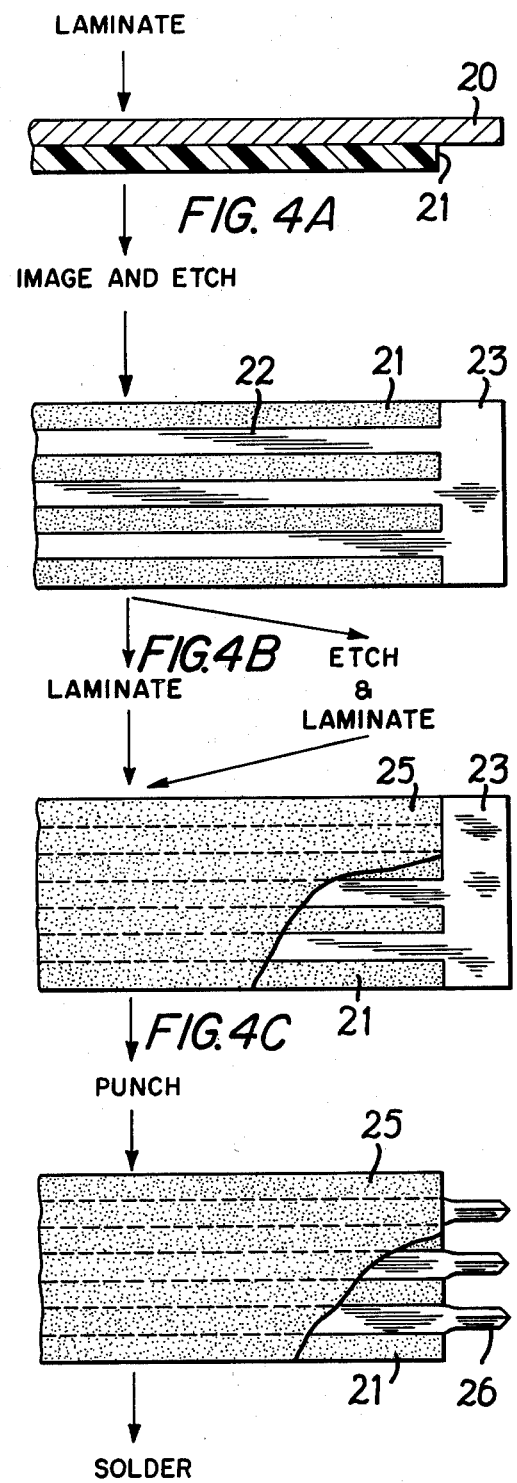

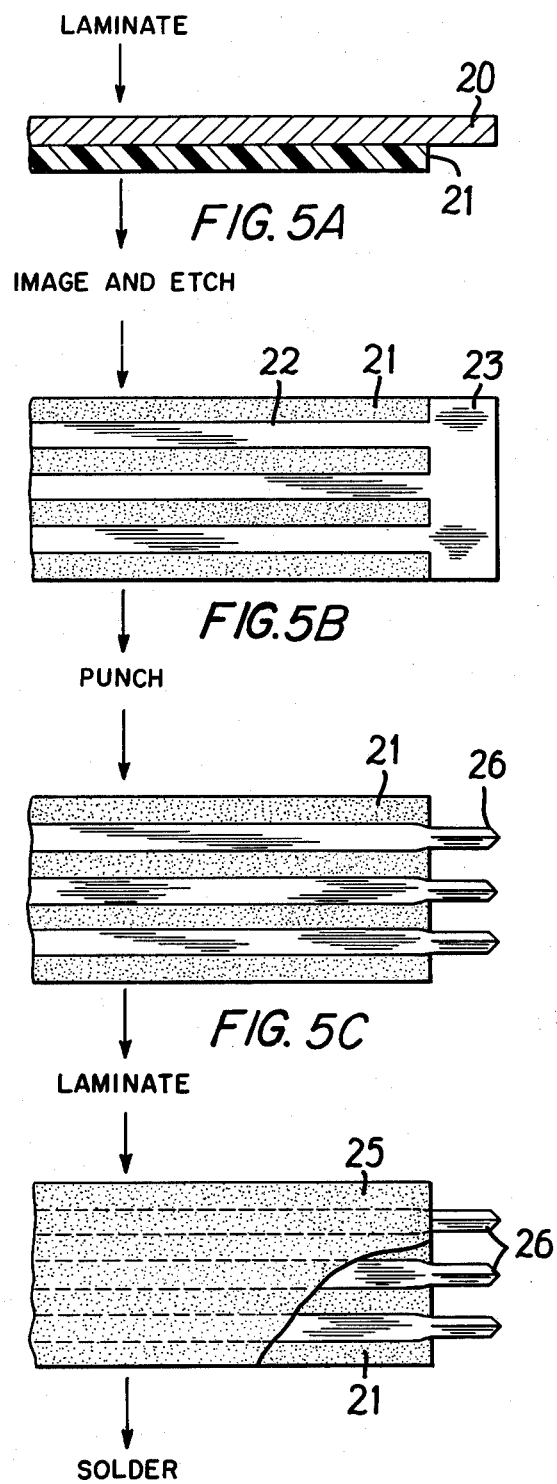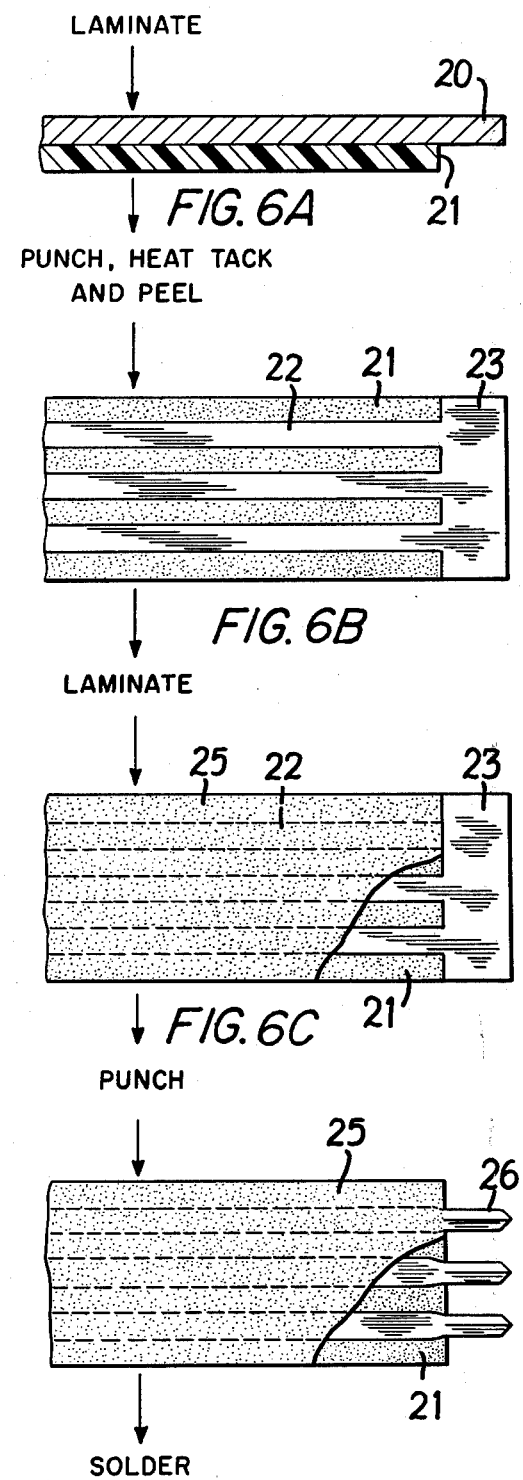

METHOD OF MAKING A FLEXIBLE JUMPER STRIP

BACKGROUND OF THE INVENTION

This invention relates to connectors and, more particularly, to flexible jumper strips.

In the construction of electrical assemblies, subsystems made on hard or flexible printed circuits are often used. These subsystems then have to be connected together with jumper cables or strips. Typically, the jumper strips are made in the form of a plurality of parallel conductors encased in an insulating layer. Such a jumper strip is shown in U.S. Pat. No. 3,221,286 issued to G. A. Fedde.

Most of the prior art jumper strips made by printed circuit techniques are relatively expensive and are also deficient in several other respects. In particular, they are either not flexible or they tend to flex or bend in the wrong areas. The weakest point is often where the pins enter the insulation. This results in a sharp crease or bend which can eventually lead to the breaking of the pin. Also, the flexing of such jumpers leads to a separation of the insulating layer from the conductor. To overcome these problems a flexible jumper made by flattening the middle portions of round wires and encasing them in insulation is disclosed in U.S. Pat. No. 3,601,755 issued to J. F. Shiells, Jr. The insulation of this jumper extends far enough up the flattened wire section to prevent the relatively stiff round wire portion from sharply bending the flattened section at the edge of the insulation. However, with such a jumper arrangement, there is little of the freedom of design that is possible with a jumper formed by printed circuit techniques. Also, the flattening of the wire may produce mechanical stresses that could eventually cause the wire to fail.

SUMMARY OF THE INVENTION

The present invention is directed to a flexible jumper strip and to a method of making it. This jumper strip overcomes the problems of the prior art because the ends of the conductor leads or pins are reinforced by being given a V-shape. Consequently, the pins do not break and the insulation does not separate from the leads.

In an illustrative embodiment of the invention, the jumper strip is in the form of a printed circuit conductor pattern laminated between two sheets of insulation. The conductor lead ends or pins which extend beyond the insulation are formed with a V-shape.

An exemplary process for making the jumper strip involves the steps of:

1. laminating an adhesive coated insulation to a larger strip of conductor so that the conductor overhangs the insulation at both ends, 2. etching the conductor so as to create a conductor pattern with conductor leads extending across the insulation and inner and outer dam areas connecting together the portions of the leads extending past the insulation at a certain distance from the insulation and at the ends of the conductor, respectively, 3. shearing off the outer dam areas and folding the conductor pattern at the inner dam areas so that the lead portions which were beyond the inner dam areas rest on the portion of the leads before the inner dam area up to a point extending onto the insulation sheet, 4. laminating a second insulation sheet over the exposed conductor leads so as to encapsulate the portions of the leads on the first insulation sheet, 5. punching a portion of the cable leads from the folded dam areas in such a way as to impart a V-shape to the ends of the leads extending at least to the insulation, and 6. soldering the exposed leads.

As an alternative the pins or the ends of the leads can be entirely punched out of the dam area with the V-shape without etching or folding the conductor in that area. In such a case the second insulation can be added either before or after the punching is carried out. Also, the conductor pattern can be punched out of the conductor sheet with an appropriate die, whereby it would not be necessary to etch any part of the conductor pattern.

BRIEF DESCRIPTION OF THE DRAWINGS

The foregoing and other features of the present invention will be more readily apparent from the following detailed description and drawings of illustrative embodiments of the invention in which:

FIGS. 3A–3D are a flow diagram showing an exemplary process according to the present invention for making a flexible printed circuit jumper cable, FIGS. 4A–4D are a flow diagram of two modifications of the process of FIG. 3, FIGS. 5A–5D are a flow diagram of a modification of the process of FIG. 4, and FIGS. 6A–6D are a flow diagram of a process for making a jumper cable without etching.

DESCRIPTION OF EXEMPLARY EMBODIMENTS

Figure 1:
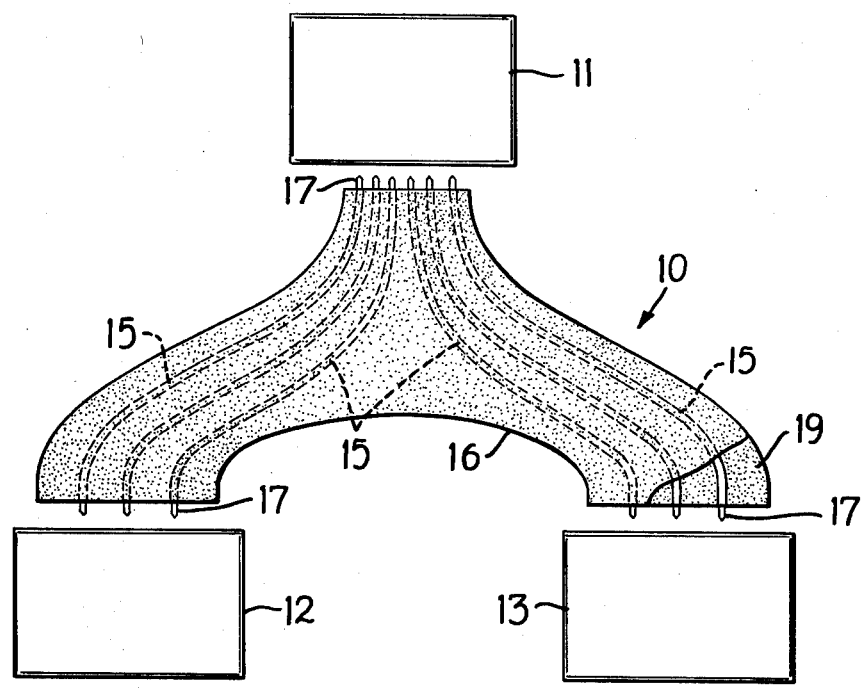
FIG. 1 shows a flexible printed circuit jumper strip according to the present invention connecting several circuit subassemblies.
Figure 2B:
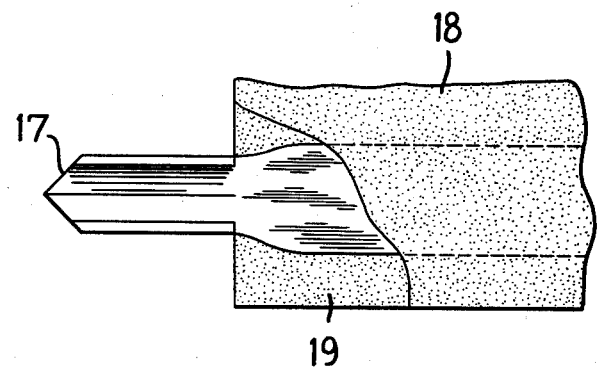
FIGS. 2A, 2B and 2C are enlarged front, top and side views, respectively, of a pin or lead end of the jumper according to the present invention.
Figure 2A:
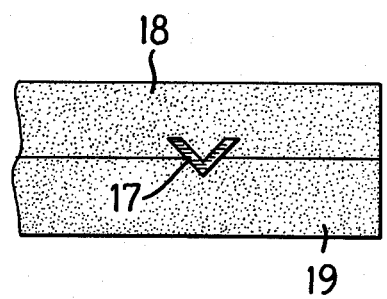
Figure 2C:
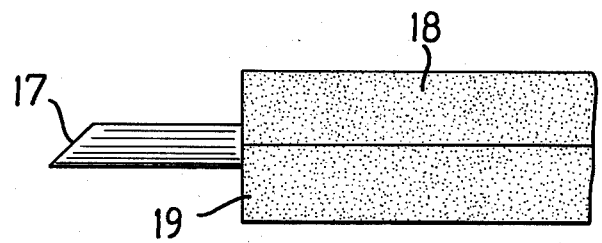

In FIG. 1 a flexible printed circuit jumper 10 is shown connecting printed circuits 11, 12 and 13. This jumper has conductor leads 15 embedded in an insulating layer 16, which, as is shown in FIG. 2, may comprise two separate insulating sheets 18 and 19 laminated onto both sides of the leads. The ends of the leads or pins 17 are each formed with a V-shape in the plane perpendicular to the plane of the drawing of FIG. 1 (See FIG. 2A) the arrangement of the pins is shown in greater detail in FIGS. 2A, 2B and 2C. In particular, FIGS. 2B and 2C show that the pin 17 can also have a V-shaped end in top view and a slanted end in side view. Such a construction aids in the insertion of the pins into corresponding connector holes on the printed circuits (not shown), but it is usually not necessary with narrow pins.

The jumper 10 of FIG. 1 is flexible because a flexible conductor, such as 2 oz. copper, is typically used. Also, the insulation is flexible and can be made from materials such as Dupont Kapton ®.

Various processes are available for making the jumper cables and they are illustrated in FIGS. 3–6. In those figures, similar parts are marked with the same reference numbers.

In making the printed circuit of FIG. 1 with the pins shown in FIG. 2, the process illustrated in FIG. 3 can be used. In this process an adhesive coated insulation sheet 21 is laminated to a larger conductor sheet 20 so that an overhang is created at the locations where pins are to be formed. FIG. 3 shows only one such area, but it should be understood that the typical jumper has at least two such areas and the jumper 10 of FIG. 1 has three such areas. After the laminate is formed, a printed circuit pattern having the desired configuration is created in the conductor sheet by an image and etch process or a screen and etch process. The pattern has conductor leads 22 which extend to an outer dam area 24 at the end of the overhanging part of the conductor sheet 20. This dam area, which connects all of the leads 22, is provided to allow for ease of handling of the overhang area. A second or inner dam area 23 is located between the edge of the insulation 21 and the dam area 24.

The overhanging conductor is next sheared along a line between dams 23 and 24. A fold is then made in the dam area 23 along a fold line so that the leads to the right of the shear line in the drawing of FIG. 3 lie on top of a portion of the leads to the left of dam 23. The shear and fold lines are chosen so that the double layer of conductor lead extends onto the insulation 21. Next a second sheet of adhesive coated insulation 25 is laminated over the conductor leads, thus enclosing them in insulation.

A die is then used to punch out the ends of the leads or pins 26 from the dam 23. The punching operation creates a pin whose width is smaller than the rest of the lead and which has the V-shape shown in FIG. 2. It is also possible to reverse the procedure in the last step by punching the pins out of the dam 23 prior to laminating the second insulation sheet 25 on top of the leads. In either case, the V-shape of the pin extends back to the vicinity of the insulation and can even be extended to the part of the lead on the insulation. The preferred procedure, however, is to apply the insulation before punching out the pins and to terminate the V-shape short of the insulation.

As a final step of the process the pins are soldered. This solder step together with the V-shape and double thickness of the pins, gives them extra strength. In fact it has been found that when the pins are given the V-shape alone, the jumper flexes over the portion of its length that is within the insulation and not at the point where the pins enter the insulation. As a result, the pins do not break as readily as the pins of the prior art jumpers and the insulation does not separate.

The pins are usually smaller than the rest of the leads because wide leads are desirable for current conduction, but narrow pins are needed to fit into the connector holes in the printed circuits, e.g. circuits 11–13 in FIG. 1. Also, using narrow pins reduces the problems related to registering the die with respect to the etched leads.

With the process of FIG. 4, the jumper cable can be made with a single thickness for the pins, i.e. the folding step is eliminated. Since there is no folding step the printed circuit formed on the laminate of the conductor 20 and the insulator 21, has a single dam area 23 covering the entire overhang region. A second sheet of insulation 25 is then laminated over the leads. Next, the pins 26 are punched from the dam area 23 in the same manner as in the process of FIG. 3 and the pins 26 are soldered. This process can be modified as shown in FIG. 5 by applying the second insulation sheet 25 over the leads after the pins are punched out. Otherwise, the process of FIG. 5 is the same as the process of FIG. 4, except that the V-shape in FIG. 5 has been carried back onto the insulation.

Although the process of FIG. 4 does not involve a folding step, it is possible to use the process to make pins that are thicker than the rest of the leads. In such a case a thick conductor layer, such as 4 oz. copper, is laminated to insulation layer 21. Then the lead patterns are etched. However, at the next step the leads themselves are etched to reduce them to 2 oz. copper. Following this, the second insulation layer 25 is added and the pins are punched from the 4 oz. copper of the dam 23. As a final step the pins are soldered. With this process the pins will have the thickness of 4 oz. copper and the leads will have the thickness of the 2 oz. copper.

The process of FIG. 6 provides for the manufacture of the jumper without an image and etch step. In this process the conductor layer of the laminate is punched with a die that has the desired circuit or lead pattern. This will merely cut through the copper to the insulation in the proper places. Then heat is applied to the die so as to heat tack the lead areas to the insulation. The unwanted conductor area is then peeled from the insulator leaving the desired pattern. After this, the process is the same as in FIG. 4, i.e. the insulation 25 is laminated over the leads, the pins are punched out and the pins are soldered. If necessary, the leads can be press cycled to cure the adhesive to its final state prior to the pin punch operation.

While the invention has been particularly shown and described with reference to preferred embodiments thereof, it will be understood by those skilled in the art that various changes in form and details may be made therein without departing from the spirit and scope of the invention.

We claim:

1. A process for making a jumper strip with pin-like lead ends comprising the steps of:
    laminating a conductor sheet and a smaller adhesive coated first insulation sheet together so that the conductor sheet extends beyond the area of the first insulation sheet in the area where the jumper pins are to be formed;
    etching the conductor sheet so as to form a conductor pattern from the conductor sheet, which pattern includes conductor leads ending in the area beyond the first insulation sheet, the conductor pattern in the area extending beyond the first insulation sheet also having a dam area connecting the leads, said dam area beginning at a certain distance from the first insulation sheet and ending at a certain distance from the end of the leads;
    folding the conductor pattern in the area of the dam so that the leads which were beyond the dam area rest on a portion of the leads before the dam area extending onto the first insulation sheet;
    forming a jumper pin at the end of each lead in the area beyond the first insulation sheet, said pins extending from a position on the first insulation sheet to the lead end, and
    imparting a V-shaped cross section to the pins in their transverse direction in at least part of those portions of the pins that extend beyond the first insulation sheet.

2. The process of claim 1, further including the step of laminating a second insulation sheet over the exposed conductor leads so as to encapsulate the portion of the folded-back leads overlying the leads on the first insulation.

3. The process of claim 1, wherein the step of forming a jumper pin and imparting a V-shape is carried out by punching a portion of the leads out of the folded dam area with a device that imparts a V-shape to at least a portion of that part of the lead extending beyond the first insulation sheet.

4. The process of claim 3, further including the step of applying solder to the jumper pins.

5. A process for making a jumper strip with pin-like lead ends comprising the steps of:
- laminating a conductor sheet and a smaller adhesive coated first insulation sheet together so that the conductor sheet extends beyond the area of the first insulation sheet in the area where the jumper pins are to be formed;
- forming a conductor pattern from the conductor sheet, which pattern includes conductor leads, by etching the conductor sheet on the first insulation sheet and not etching the conductor sheet in the area extending beyond the first insulation sheet; and
- forming a jumper pin at the end of each lead extending from a position on the first insulation sheet to the lead end and imparting a V-shaped cross section to the pins in their transverse direction by punching a portion of the leads out of the conductor sheet extending beyond the area of the first insulation sheet with a device that imparts a V-shaped cross section to at least a portion of the punched-out leads.

6. The process of claim 5, further including the step of laminating a second insulation sheet over the exposed conductor leads.

7. The process of claim 5, further including the step of laminating a second insulation sheet over the exposed conductor leads prior to punching a portion of the leads out of the conductor sheet.

8. The process of claim 6, wherein the V-shape extends to a portion of the etched leads on the first insulation sheet and the first and second insulation sheets encapsulate a portion of the V-shaped portion of the leads.

* * * * *